(12) United States Patent
Petruzzi

(10) Patent No.: US 9,472,948 B2
(45) Date of Patent: Oct. 18, 2016

(54) ON CHIP REVERSE POLARITY PROTECTION COMPLIANT WITH ISO AND ESD REQUIREMENTS

(71) Applicant: Infineon Technologies AG, Neubiberg (DE)

(72) Inventor: Luca Petruzzi, Goedersdorf (AT)

(73) Assignee: Infineon Technologies AG, Neubiberg (DE)

( * ) Notice: Subject to any disclaimer, the term of this patent is extended or adjusted under 35 U.S.C. 154(b) by 321 days.

(21) Appl. No.: 14/042,155

(22) Filed: Sep. 30, 2013

(65) Prior Publication Data

US 2015/0092307 A1   Apr. 2, 2015

(51) Int. Cl.
| | |
|---|---|
| *H02H 9/04* | (2006.01) |
| *H01L 27/02* | (2006.01) |
| *H01L 29/78* | (2006.01) |
| *H01L 21/761* | (2006.01) |
| *H01L 29/866* | (2006.01) |
| *H01L 27/092* | (2006.01) |

(52) U.S. Cl.
CPC .......... *H02H 9/041* (2013.01); *H01L 27/0248* (2013.01); *H01L 27/0922* (2013.01); *H02H 9/043* (2013.01); *H01L 21/761* (2013.01); *H01L 27/0921* (2013.01); *H01L 29/7835* (2013.01); *H01L 29/866* (2013.01)

(58) Field of Classification Search
CPC .. H02H 9/041; H02H 11/002; H02H 11/003; H01L 23/60; H01L 27/0248
USPC .......................................................... 361/84
See application file for complete search history.

(56) References Cited

U.S. PATENT DOCUMENTS

| | | | | |
|---|---|---|---|---|
| 3,405,329 A | * | 10/1968 | Rosenbaum | .......... H01L 23/291 |
| | | | | 257/488 |
| 4,958,251 A | * | 9/1990 | Cini | ..................... H02H 11/003 |
| | | | | 307/127 |
| 5,410,441 A | * | 4/1995 | Allman | ................. H02H 11/003 |
| | | | | 307/127 |
| 5,781,390 A | * | 7/1998 | Notaro | .................... H02H 9/046 |
| | | | | 307/127 |
| 6,304,422 B1 | * | 10/2001 | Sander | .................. H02H 11/003 |
| | | | | 307/127 |
| 8,040,647 B2 | * | 10/2011 | Logiudice | ............ H02H 11/003 |
| | | | | 361/84 |

(Continued)

OTHER PUBLICATIONS

"Road vehicles—Electrical disturbances from conduction and coupling—Part 2: Electrical transient conduction along supply lines only," International Standard, Second Edition, 2004, pp. 1-41, 7637-2:2004(E), ISO, Switzerland.

(Continued)

*Primary Examiner* — Stephen W Jackson
*Assistant Examiner* — Christopher Clark
(74) *Attorney, Agent, or Firm* — Slater Matsil, LLP

(57) ABSTRACT

A semiconductor device is disclosed. In one embodiment a semiconductor device includes a semiconductor chip including a substrate, a ground terminal configured to be provided with a reference potential and a supply terminal electrically coupled to the substrate, the supply terminal configured to be provided with a load current and configured to be provided with a supply voltage between the substrate and the ground terminal. The semiconductor device further comprises an overvoltage protection circuit disposed in the semiconductor chip and coupled between the supply terminal and the ground terminal, the overvoltage protection circuit including a first transistor having a load current path coupled between the supply terminal and an internal ground node and a second transistor having a load current path coupled between the internal ground node and the ground terminal.

17 Claims, 7 Drawing Sheets

(56) References Cited

U.S. PATENT DOCUMENTS

| | | |
|---|---|---|
| 2005/0135037 A1 | 6/2005 | Thiery et al. |
| 2011/0195744 A1* | 8/2011 | Zhang ............... H02H 11/003 455/550.1 |
| 2012/0169116 A1* | 7/2012 | Graf .................. H02J 7/0034 307/10.7 |
| 2012/0176161 A1* | 7/2012 | Petruzzi ............ H01L 27/0251 327/63 |
| 2013/0027114 A1* | 1/2013 | Petruzzi ............ H03K 17/0822 327/437 |
| 2014/0029146 A1* | 1/2014 | Pavlin ................ H01L 27/0248 361/84 |

OTHER PUBLICATIONS

"SPI Power Controller," SPOC—BTS5460SF for Advanced Front Light Control, Automotive Power, Apr. 12, 2010, pp. 1-58, Data Sheet Rev. 1.0, Infineon.

"SPI Power Controller," SPOC—BTS5682E, Automotive Power, Jan. 22, 2008, pp. 1-46, Data Sheet Rev. 1.0, Infineon.

* cited by examiner

Fig. 1 (normal operation)

Fig. 2 (reverse polarity operation)

ON CHIP REVERSE POLARITY PROTECTION COMPLIANT WITH ISO AND ESD REQUIREMENTS

TECHNICAL FIELD

The present description relates to circuits providing a reverse polarity protection for semiconductor switches, particularly for a semiconductor device including a plurality of MOS high side switches which may be integrated in an n-doped substrate.

BACKGROUND

A multi-channel switching device usually includes one power semiconductor switch (usually a MOSFET) per output channel wherein an electric load is connected to each output channel. Thus, each electric load may be switched on and off using the respective semiconductor switch. For example, an on-resistance of 100 mΩ and a nominal load current of 1 A can result in a power loss of 100 mW for each active output channel of the power semiconductor switch. Each power semiconductor switch has usually a reverse diode coupled in parallel to the load current path of the semiconductor switch (e.g., the drain-source path in case of a MOSFET). During normal operation, which entails positive supply voltages up to 60 V, this reverse diode is reverse biased and in a blocking state. However, when a negative supply voltage is applied, the reverse diode becomes forward biased and load current may be directed form ground through the load and the reverse diode to the negative supply potential. Assuming a diode forward voltage of at least 0.7 V the resulting power loss in the reverse diode (and thus in the switching device) is 700 mW per output channel, at least seven times more as during normal operation. Such a situation may be hazardous for the switching device and appropriate reverse polarity protection circuitry is required. Generally, the current between the supply terminal and the ground terminal of the semiconductor device should be limited to a few milliamperes in the case of reverse polarity (e.g., negative supply voltages of −16 V or more). However, an overvoltage (e.g., positive supply voltages of more than 60 V or negative supply voltages of less than −16 V) may occur at the supply terminals of a switching device due to electrostatic discharge (ESD) or the like. In such events, a low resistive current path should be provided to dissipate the energy and clamp the voltages to defined limits.

Known circuitry providing reverse polarity protection and ESD protection to smart semiconductor switches is comparably complex and requires significant chip space. Thus, there is a need for a smart semiconductor switch including an efficient reverse polarity protection (as far as circuit complexity and chip space requirement are concerned).

SUMMARY OF THE INVENTION

A semiconductor device is disclosed herein. The semiconductor device comprises a semiconductor chip including a substrate. In accordance with one example of the invention the semiconductor device includes a ground terminal to be provided with a reference potential, and a supply terminal electrically coupled to the substrate to provide a load current to the substrate and to apply a supply voltage between the substrate and the ground terminal. The semiconductor device further includes an overvoltage protection circuit which is integrated in the semiconductor chip and coupled between the supply terminal and the ground terminal. The overvoltage protection circuit comprises a first transistor having a load current path, which is coupled between the supply terminal and an internal ground node, and a second transistor having a load current path, which is coupled between the internal ground node and the ground terminal. The second transistor is operably switched on, when the supply voltage between the substrate and the ground terminal is positive. The first transistor is operably switched on when the supply voltage between the substrate and the ground terminal is negative. The first transistor is operably switched off when the supply voltage between the substrate and the ground terminal is positive but below a pre-defined maximum voltage. The second transistor is operably switched off when the supply voltage between the substrate and the ground terminal is negative but above a pre-defined minimum voltage. However, the first transistor is configured to be switched on when the supply voltage between the substrate and the ground terminal is positive and exceeds the pre-defined maximum voltage; and the second transistor is configured to be switched on when the supply voltage between the substrate and the ground terminal is negative and below the pre-defined minimum voltage.

BRIEF DESCRIPTION OF THE DRAWINGS

The invention can be better understood with reference to the following drawings and descriptions. The components in the figures are not necessarily to scale, instead emphasis is placed upon illustrating the principles of the invention. Moreover, in the figures, like reference numerals designate corresponding parts. In the drawings.

DETAILED DESCRIPTION OF ILLUSTRATIVE EMBODIMENTS

Figure 1:
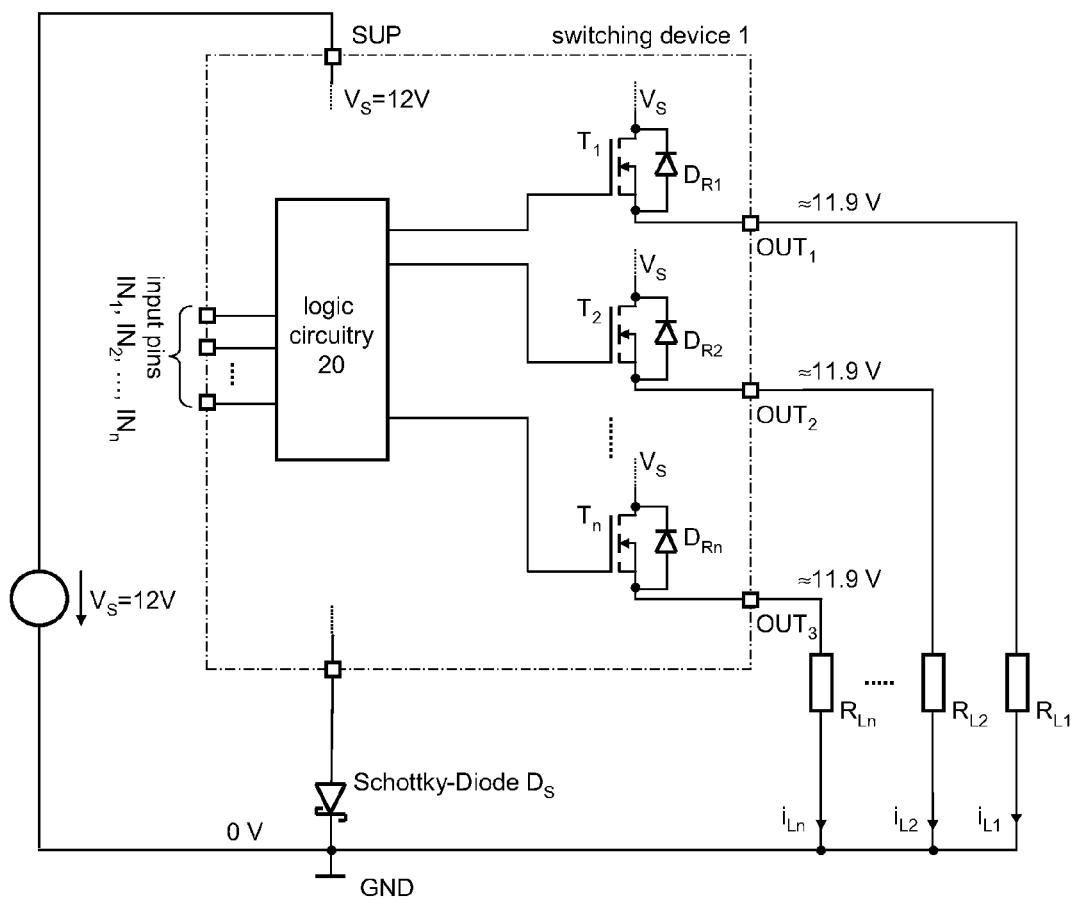
FIG. 1 is an exemplary switching device with multiple output channels, each channel including one high-side n-channel MOS transistor, exemplary voltage levels are specified for normal operation.
Figure 2:
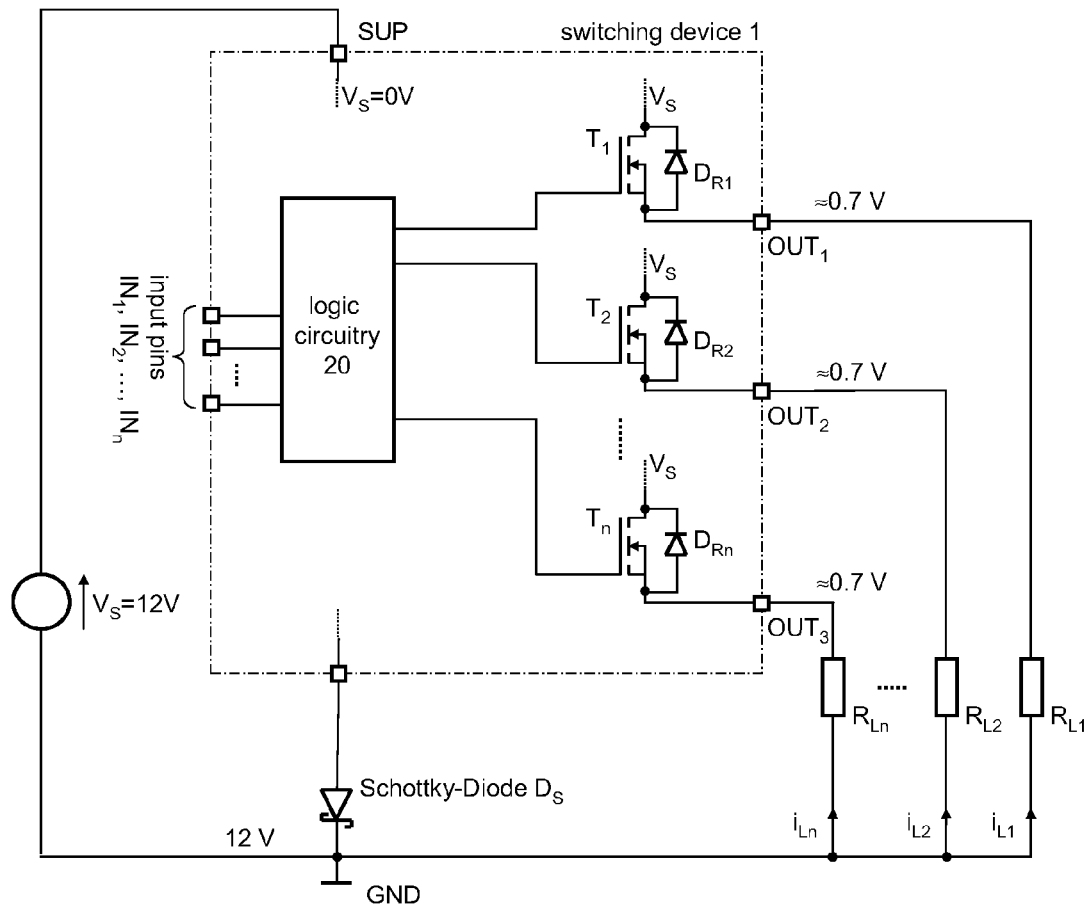
FIG. 2 illustrates the same circuit as FIG. 1, exemplary voltage levels are specified for reverse polarity operation.

FIG. 1 illustrates an exemplary multi-channel switching device that includes a plurality of output channels. Each channel includes one high-side semiconductor switch. The examples presented herein are related to n-channel MOS transistors that are used as high-side power semiconductor switches. In particular, vertical power MOS transistors (e.g., vertical MOS transistors with or without a trench-gate) are considered. FIG. 1 includes labels indicating the voltage levels for different circuit nodes in case of normal operation (positive supply voltage $V_S$=12 V, ground potential $V_{GND}$=0 V). FIG. 2 illustrates the same circuit. However, the labels included in FIG. 2 indicate the voltage levels for the circuit nodes in case of reverse polarity operation (supply voltage $V_S$=0 V, ground potential $V_{GND}$=12 V up to 60 V).

The exemplary circuit of FIGS. 1 and 2 include a switching device 1 that is supplied with a supply voltage $V_S$, at a supply terminal SUP, and with a corresponding reference potential, further referred to as ground potential $V_{GND}$, at a ground terminal GND. The supply voltage may be, for example, provided by an automotive battery. The switching device includes a plurality of n-channel high-side MOS transistors $T_1, T_2, \ldots, T_n$ wherein each one of the transistors is associated with a respective output channel. Each transistor $T_1, T_2, \ldots, T_n$ has a load current path (e.g., the drain-source current path in case of a MOS transistor) that (internally) couples a respective output terminal $OUT_1$, $OUT_2, \ldots, OUT_n$ to the supply terminal (potential $V_S$). That is, dependent on the switching state (on or off) of each one of the transistors $T_1, T_2, \ldots, T_n$ a respective low-resistance current path is provided (via the transistor's load path) from the supply terminal SUP to the output terminal $OUT_1$, $OUT_2, \ldots, OUT_n$ associated with an output channel. Electric loads may be connected between the output terminals $OUT_1, OUT_2, \ldots, OUT_n$ ground. The switching state of a transistor $T_1, T_2, \ldots, T_n$ is set in accordance with a respective control signal (e.g., a gate current or a gate voltage in case of a MOSFET) which is provided, for example, using a gate driver circuit (not shown), wherein a gate driver circuit generates the control signals in accordance with input signals supplied to respective input pins $IN_1, IN_2, \ldots, IN_n$. One input signal may be provided for each output channel. A logic circuitry 20 may be employed for preprocessing (which may include, e.g., level-shifting) the signals supplied to the input pins $IN_1, IN_2, \ldots IN_n$. Typically, the logic circuitry generates the control signals supplied to the gate drivers dependent on the signals supplied to the input pins $IN_1, IN_2, \ldots IN_n$.

Each transistor $T_1, T_2, \ldots, T_n$ has a reverse diode $D_{R1}$, $D_{R2}, \ldots, D_{Rn}$ connected parallel to the transistor's load current path. For MOS transistors, these diodes $D_{R1}$, $D_{R2}, \ldots, D_{Rn}$ are usually intrinsic reverse diodes which always exists due to the internal structure of the transistor. Other transistors, which do not have an intrinsic reverse diode, may have an external reverse diode to allow freewheeling when switching inductive loads.

In order to provide a reverse polarity protection of the internal circuitry of the switching device 1 it is known to connect a diode, e.g., a Schottky diode $D_S$, between the ground terminal of the switching device and the actual ground potential provide by the power supply (e.g., the automotive battery). Instead of the diode a resistor may be used in order to limit the reverse current in case of a reversed polarity of the power supply (reverse battery). A resistance of 100Ω may be appropriate. In this case voltage drop across the resistor will not significantly exceed 500 mV (assuming a load current of 5 mA during normal operation). However, during reverse polarity operation, the load current would be only limited by this resistor. Assuming a reverse supply voltage of −16 V, the power dissipation in the resistor would amount to 2.56 W. Thus, the resistor would have to be a power resistor, which is undesired for several reasons. However, the Schottky diode or, alternatively, the mentioned resistor, can be replaced by a more sophisticated circuit as will be described later.

The labels indicating the voltage levels present at various circuit nodes refer to voltage levels during normal operation in FIG. 1 and to voltage levels during reverse polarity operation in FIG. 2. During normal operation the ground terminal has a voltage level of 0 V, whereas the supply terminal has a positive voltage level of, e.g., $V_S$=12 V in the case of an automotive battery. When an output transistor $T_1$, $T_2, \ldots, T_n$ is active, the on resistance and thus the voltage drop across the transistor's load path is low (and negligible as compared to the supply voltage). In the present example a voltage drop of 100 mV across the output transistors $T_1$, $T_2, \ldots, T_n$ is assumed so that the voltage at the output terminals $OUT_1, OUT_2, \ldots, OUT_n$ is 11.9 V.

During reverse polarity operation (see FIG. 2) the supply voltage of 12 V is applied reversely to the switching device 1. That is, the ground terminal is at 12 V and the supply terminal is at a voltage level of 0 V. As a consequence the reverse diodes $D_{R1}, D_{R2}, \ldots, D_{Rn}$ become forward bias and thus conductive. The voltage drop across each diode is typically at least 0.7 V (as compared to 0.1 V in the prior case of normal operation) and thus the power losses are at least a factor seven higher than in the case of normal operation.

Figure 3:
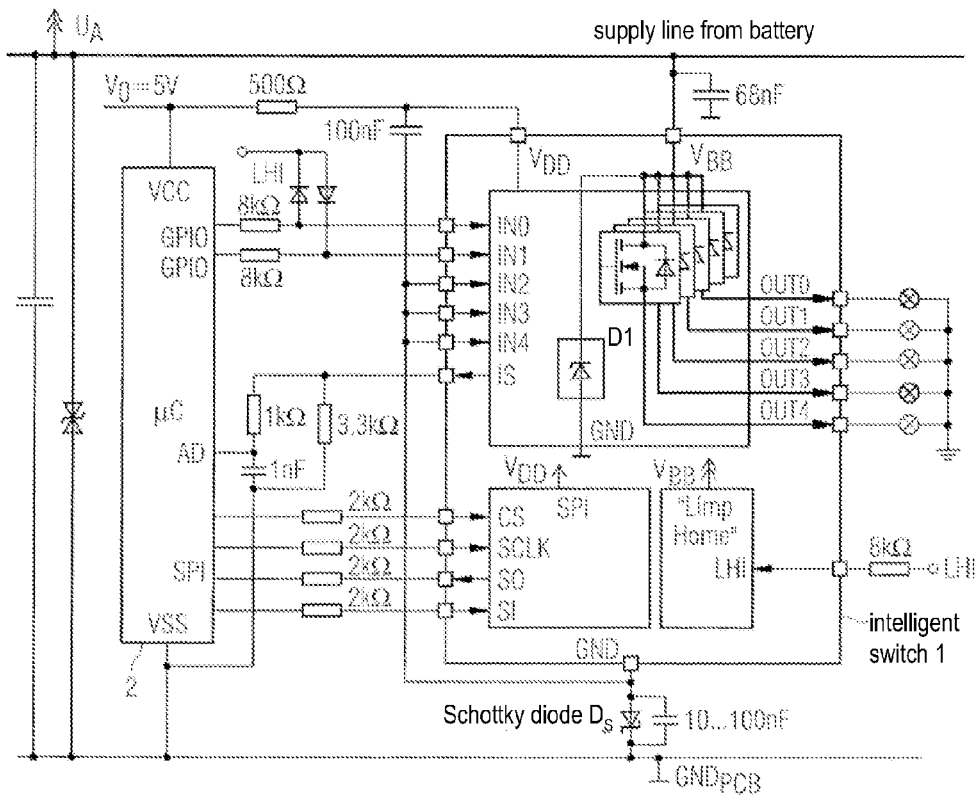
FIG. 3 illustrates, in an exemplary manner, a block diagram including some parts of a smart switch.

FIG. 3 illustrates, as block diagram, an electronic module including the smart power switch 1 of FIG. 2 and a micro controller 2 which is configured (e.g., using an appropriate software) to control the operation of the smart power switch 1. The smart power switch may actually include more than one (in the present case five) output channels, wherein each output channel provides a current path from the battery supply pin $V_{BB}$ to the respective output pin $OUT_0$ to $OUT_4$. Each current path can be activated and deactivated by switching on and off the respective power MOS transistor (cf. transistors $T_1$ to $T_n$ in FIG. 1).

In order to provide an over voltage (OV) protection, an OV protection device $D_1$ is internally coupled between the ground terminal GND and the supply terminal $V_{BB}$ of the smart switch 1. The OV protection device may be a zener diode, a high voltage MOS transistor operated in active clamping mode or the like. It can be seen from the example of FIG. 3 that, in reverse polarity operation, the OV protection device would practically short-circuit the ground terminal GND and the supply terminal $V_{BB}$ of the smart switch, and a destructive over-current is only blocked by the (external) Schottky diode $D_S$.

The electronic module illustrated in FIG. 3 usually includes a printed circuit board (PCB, not shown) to which the smart power switch 1 and the micro controller 2 are attached (amongst other components). The ground pin GND of the smart power switch 1 and the ground terminal $GND_{PCB}$ of the module (connected with the battery) are coupled via the mentioned Schottky diode $D_S$ which is provided in order to protect the module against reverse polarity. As can be seen from FIG. 3 resistors of, e.g., 2 kΩ can be provided in series to the SPI bus lines connecting an SPI interface (SI, SO, SCLK, CS) of the smart power switch to a corresponding SPI interface of the micro controller 2. It should be noted that many commonly used micro controllers are provided with integrated SPI interfaces. Unlike the smart power switch, the micro controller 2 does not require a Schottky diode for protection against reverse polarity of the supply voltage, as the micro controller 2 is usually supplied via a voltage regulator (e.g., 5 V regulator) which typically includes a sufficient reverse polarity protection.

The input ports $IN_0$ to $IN_4$ (short $IN_x$, x=0, 1, . . . , 4) provide one option to activate or deactivate the respective power semiconductor switches coupled to the corresponding outputs OUT0 to OUT4 (short $OUT_x$, x=0, 1, . . . , 4). If an input port $IN_x$ is driven with a high voltage level (e.g., 5 V) then the respective output $OUT_x$ is activated by switching on the corresponding power semiconductor switch (cf. FIG. 1). Conversely, a low level (e.g., 0 V) may switch off the respective power semiconductor switch. Alternatively, the switches are activated or deactivated using appropriate SPI commands received via the serial SPI interface.

Figure 4:
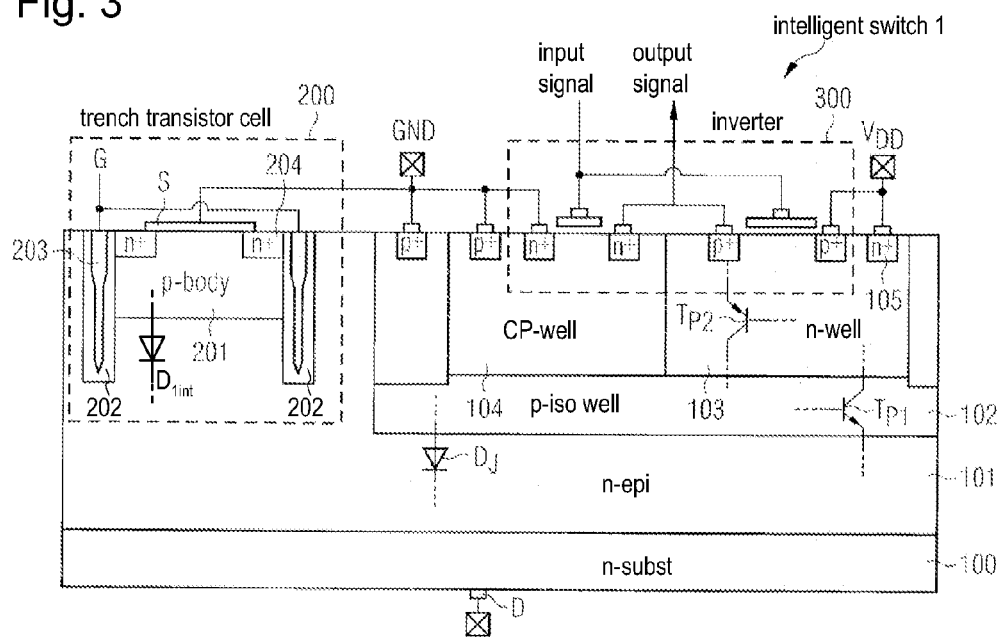
FIG. 4 illustrates, in an exemplary manner, a schematic cross section through a part of a semiconductor body forming, e.g., a smart switch.

FIG. 4 illustrates (in parts) one exemplary implementation of a smart switch 1 (such as the smart switch 1 of FIG. 3) integrated in an n-substrate (i.e., n-doped silicon substrate). The purpose of that illustration is to pinpoint some problems which may occur during reverse polarity operation of the smart switch. FIG. 4 illustrates the typical set-up of a vertical n-channel power MOSFET. That is, an n-doped epitaxial layer 101 is formed on an n-doped semiconductor substrate 100. One transistor cell 200 of a MOSFET is formed by a p-doped body region 201 arranged in the epitaxial layer 100 between two trenches 202 in which gate electrodes 203 are provided (typically by filling the trenches with polycrystalline silicon). Adjoining to the top surface of the body region 201 and to the sidewalls of the trenches 202, $n^+$-doped source regions 204 are formed which are connected to a source electrode S. The drain electrode D is connected to the n-substrate 100 at the bottom surface of the semiconductor substrate 100. The present transistor cell 200 is to be regarded as one illustrative example. In an actual implementation, a plurality of transistor cells are coupled in parallel to form a single transistor.

In the present example, the source electrode of the transistor cell 200 is connected to the ground terminal, whereas the source electrodes of "normal" power MOSFETs would be connected to a respective output terminal, such as the output terminals $OUT_0$ to $OUT_4$ shown in FIG. 3. In contrast to this, the transistor cell 200 forms part of the OV protection device $D_1$ and thus couples (via the drain electrode D) the supply terminal $V_{BB}$ with the ground terminal GND (via the source electrode S). The gate electrode G of the transistor cell 200 is coupled to the drain electrode D via a clamping circuit (not shown) which is configured to activate (switch on) the transistor cell 200 when the drain voltage (i.e., the voltage present at the supply terminal) exceeds a defined threshold. In such a manner the drain voltage is "clamped" to a defined maximum voltage. The transistor is said to operate in "active clamping mode" and behaves somewhat like a zener diode. In practice, a plurality of transistor cells may be coupled in parallel for this purpose. However, the intrinsic body-drain diode formed by the pn-junction between the p-body 201 and the n-epi 101 will become active when the smart switch is subject to a reverse polarity. This intrinsic body-drain diode is illustrated in FIG. 4 and labeled $D_{Iint}$. Without the Schottky diode $D_S$ connected externally between the ground terminal GND of the smart switch and the ground terminal $GND_{PCB}$ of the PCB, an over current breakdown would occur during reverse polarity operation, as the intrinsic body-drain diode $D_{Iint}$ would short-circuit the (reversed) supply voltage.

Besides the vertical (power) MOSFET 200 an inverter 300 (which may form a part of a logic circuitry) may be integrated in the semiconductor body including n-doped substrate 100 and n-doped epitaxial layer 101. The inverter 300 is separated from the power transistor 200 by a p-doped isolation well 102 which is grounded (chip pin labeled GND) during operation so that the diode formed at the junction between the isolation well 102 and the epitaxial layer 101 is reverse biased. An n-doped well 103 and a corresponding p-doped well 104 (labeled "cp-well" which is short for "CMOS p-well") is enclosed by the top surface 110 of the epitaxial layer 101 and the isolation well 102. The n- and p-doped wells 103 and 104, respectively, form the body regions of corresponding p-channel and n-channel low power MOS transistors which are electrically connected to form an CMOS inverter circuit 300, wherein the source region ($n^+$-doped) of the n-channel MOS transistor is connected to ground GND, the drain region ($n^+$-doped) of the n-channel MOS transistor and the drain region ($p^+$-doped) of the p-channel MOS transistor are connected to the inverter output and the source region ($p^+$-doped) of the p-channel MOS transistor is connected to a chip pin $V_{DD}$ providing a corresponding positive supply potential (which is not to be confused by the battery supply potential present on the supply line from the battery plied to the chip pin $V_{BB}$). In this illustrative example, the inverter 300 is representative for all logic circuitry within the smart switch which may include circuitry for signal processing (see logic circuitry 20 in FIG. 1), communication interfaces (e.g., SPI interfaces) and various other circuitry usually included in smart switches.

Figure 5:
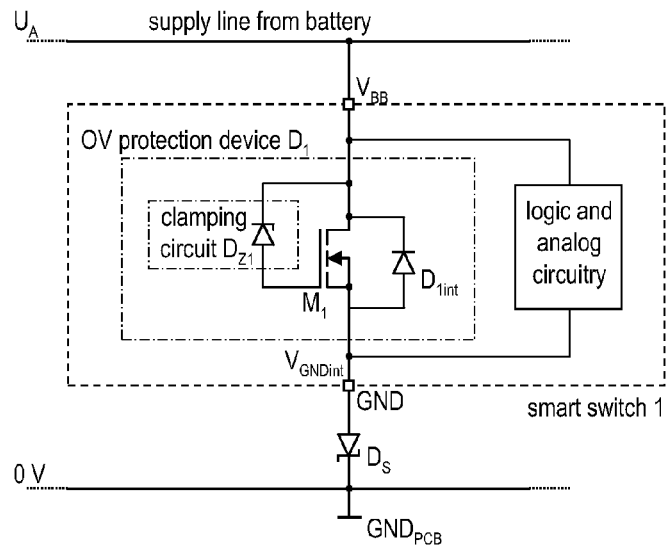
FIG. 5 illustrates an over voltage (OV) protection circuit usually used in semiconductor devices with integrated semiconductor switches.

FIG. 5 illustrates one exemplary implementation of the OV protection device $D_1$ included in a smart switch 1. The block labeled "logic and analog circuitry" represents all circuit elements of the smart switch except the OV protection device $D_1$ which is implemented using at least one MOS transistor $M_1$ coupled between the supply terminal $V_{BB}$ and the ground terminal GND of the smart switch 1. As the MOS transistor $M_1$ has to be in its blocking state, the source of the MOS transistor $M_1$ is connected to the ground terminal GND and the drain of the MOS transistor M1 is connected to the supply terminal $V_{BB}$. Thus, the intrinsic (body-drain) diode $D_{Iint}$ is reverse biased when a positive supply voltage of, e.g., 12 V is applied to the supply terminal $V_{BB}$. The gate of the MOS transistor $M_1$ is connected to the supply terminal $V_{BB}$ (and thus with the drain electrode) via a clamping circuit which may be, e.g., a simple zener diode $D_{Z1}$. In case of a voltage surge at the supply terminal $V_{BB}$, the gate voltage will rise above the MOS transistor's threshold voltage, and the MOS transistor becomes conductive thus clamping the voltage drop across the MOS transistor's load (drain-source) path. In order to prevent a destructive forward biasing of the intrinsic diode $D_{Iint}$ while the voltage at the terminal supply $V_{BB}$ is negative (i.e., at reverse polarity), an external diode $D_S$ is required in order to avoid a destructively high reverse current. To keep the voltage difference $V_{GNDint}$ between the external ground potential at node $GND_{PCB}$ and the internal ground potential at node GND low during normal operation, the diode $D_S$ may be a Schottky diode, which has a forward voltage of about half the voltage of a normal silicon diode. However, a voltage difference of about 200 mV to 300 mV still remains.

As mentioned, the Schottky diode $D_S$ or, alternatively, a power resistor is usually required to avoid an over-current breakdown of the smart power switch in case of a reversed supply voltage. The Schottky diode $D_S$ is a device connected externally to the smart switch, needs space on the PCB and increases the overall costs of the electronic module illustrated in FIG. 3. This may be a reason why it would be desirable to overcome the need for the external diode $D_S$. Another undesired "side effect" of the diode $D_S$ is that the ground potential "seen" by the circuitry within the smart switch 1 is different from the ground potential present at the PCB. Such ground potential offset adversely affects the chip design and results in an increased chips space (as compared to a case without such offset).

The examples discussed below relate to a smart switch such as the one illustrated in FIGS. 3 and 4 but including a modified OV protection device $D_1$ which allows, on the one hand, an over voltage protection and, on the other hand, to block reverse current (in case of a reversed supply voltage) so that the external Schottky diode $D_1$ is no longer needed.

Figure 6:
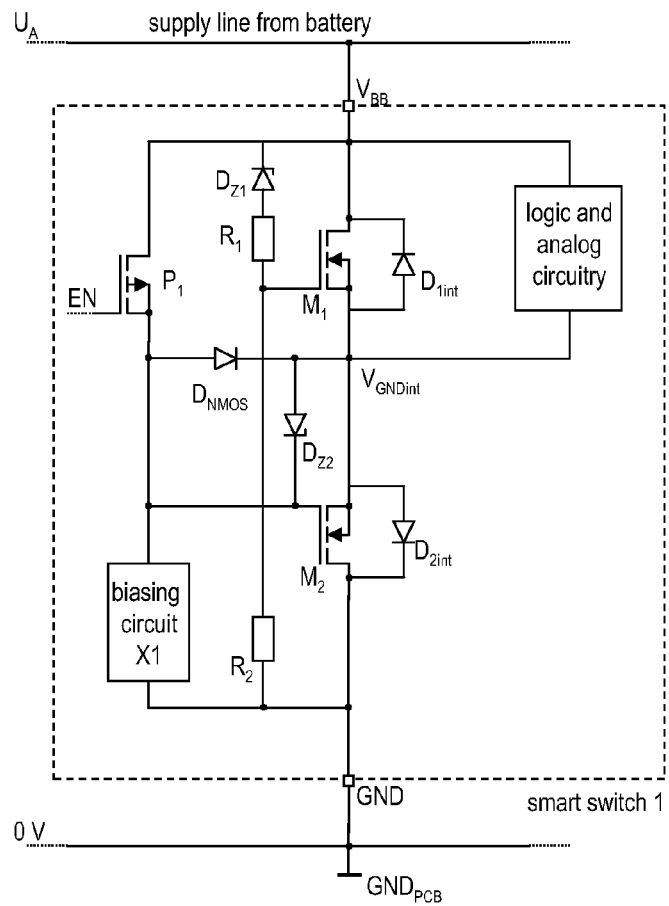
FIG. 6 illustrates an exemplary embodiment of an improved OV protection circuit which does not require an external diode for protection against reverse current.

FIG. 6 illustrates, like FIG. 5, an OV protection device. However, the OV protection device $D_1$ of FIG. 6 is a more sophisticated implementation which does not need an external Schottky diode $D_S$. Similar to the previous example of FIG. 5, a first supply terminal $V_{BB}$, a second (i.e., external ground) terminal GND and an internal ground node $GND_{INT}$ are considered. The external ground terminal is defined to be at zero volts (0 V). During normal operation a supply voltage between approximately 9 V and 16 V (typically 13.8 V) may be applied between the supply terminal $V_{BB}$ and the external ground terminal GND. During reverse polarity a respective negative voltage (−16 V to −9 V) may be present at the terminal $V_{BB}$. However, higher voltage surges (i.e., greater than 16 V or lower than −16 V) may occur due to electrostatic discharges (ESD). Generally, it is desired to "tie" the potential at the internal ground node $GND_{INT}$ closely to the lowest potential (i.e. 0 V); during normal operation the lowest potential is at the external ground terminal GND, whereas during reverse polarity operation the lowest potential is at the supply terminal $V_{BB}$.

Similar to the previous example of FIG. 5, a MOS transistor $M_1$ is coupled between the internal ground node $GND_{INT}$ and the supply terminal $V_{BB}$. The intrinsic body-drain diode $D_{1int}$ of the MOS transistor $M_1$ is reverse biased during normal operation, i.e., the source of the transistor $M_1$ is connected to the internal ground node $GND_{INT}$ and the drain of the transistor $M_1$ is connected to the supply terminal $V_{BB}$. The gate of the MOS transistor $M_1$ is connected to the supply terminal $V_{BB}$ (and thus to the drain) via a clamping circuit, which includes a zener diode $D_{Z1}$. As an option, the zener diode $D_{Z1}$ may have a resistor coupled in series. The MOS transistor $M_1$—in connection with the clamping circuit—operates analogously to the example of FIG. 4. The transistor $M_1$ is in an off-state during normal operation and clamps the voltage at the supply terminal $V_{BB}$ so a maximum of, e.g., 40 to 60 V (dependent on the chip technology used), thus suppressing voltage surges higher than the mentioned maximum.

The function of the Schottky diode $D_S$ (needed in the previous example of FIG. 5) is, in the present example, provided by a second MOS transistor $M_2$ that is coupled between the internal ground node $GND_{INT}$ and the external ground terminal GND. The source of the transistor $M_2$ is connected to the internal ground node $GND_{INT}$ and the drain of the transistor $M_2$ is connected to the external ground terminal GND. Thus, the intrinsic body-drain diode $D_{2int}$ of the transistor $M_2$ will be forward biased during normal operation (i.e., positive supply voltage at terminal $V_{BB}$) and reverse biased (i.e., blocking) during reverse polarity operation (i.e., negative voltage at terminal $V_{BB}$). The Schottky diode $D_S$ used in the previous example of FIG. 5 is replaced (inter alia) by the intrinsic diode $D_{2int}$ of MOS transistor $M_2$. Without further measures, the internal ground potential $V_{GNDint}$ would be about 0.7 V which corresponds to the forward voltage of the body-drain diode $D_{2int}$ of MOS transistor $M_2$. However, during normal operation, the MOS transistor $M_2$ can be activated (i.e., switched on) using the p-channel MOS transistor $P_1$ thus reducing the voltage difference between internal ground potential ($V_{GNDint}$) and external ground potential (0 V) to approximately 0.1 V, which is even less than the forward voltage of a Schottky diode. For this purpose the load path of the MOS transistor $P_1$ is coupled between the gate of the transistor $M_2$ and, e.g., the supply terminal $V_{BB}$ (or any other circuit node providing a sufficiently high potential during normal operation). When the gate of the MOS transistor $P_1$ is pulled to a low potential (EN=0), then the MOS transistor $M_2$ is activated, to reduce the internal ground potential from about 0.7 V to 0.1 V or even less.

During reverse polarity operation, the MOS transistor $M_2$ should be generally deactivated (i.e., in an off state). However, in order to suppress negative voltage surges having a magnitude higher than a pre-defined threshold (e.g., 16 V), the MOS transistor $M_2$ may (also during negative supply voltages) temporarily activated to clamp the voltage at the supply terminal to a corresponding negative minimum value (e.g., −16 V). In other words, the MOS transistor $M_2$ is off while the supply voltage is negative but above, e.g., −16 V. Furthermore, the transistor $M_2$ is in active clamping mode when the supply voltage is lower than, e.g., −16 V, due to a negative voltage surge (e.g., an electrostatic discharge). For this purpose a biasing circuit $X_1$ is connected between the gate and the drain of the MOS transistor $M_2$. Some exemplary implementations of the biasing circuit $X_1$ are illustrated further below in FIGS. 8 and 9. The zener diode $D_{Z2}$, which is coupled between the gate and the source of MOS transistor $M_2$, limits the gate-source voltage of the transistor in order to protect the gate oxide from an overvoltage breakthrough during an electrostatic discharge (ESD). In the present example a diode $D_{NMOS}$ is connected between the internal ground node $GND_{INT}$ and the source electrode of the MOS transistor $P_1$. During normal operation the diode $D_{NMOS}$ limits the gate-source voltage of the MOS transistor $M_2$ by limiting the gate-source voltage to approximately 2 V (corresponding to the forward voltage of the diode $D_{NMOS}$). Without the diode $D_{NMOS}$ the gate-source voltage of MOS transistor $M_2$ would equal the full supply voltage when activating the transistor $P_1$, and the gate oxide of $M_2$ could be destroyed.

Figure 7:
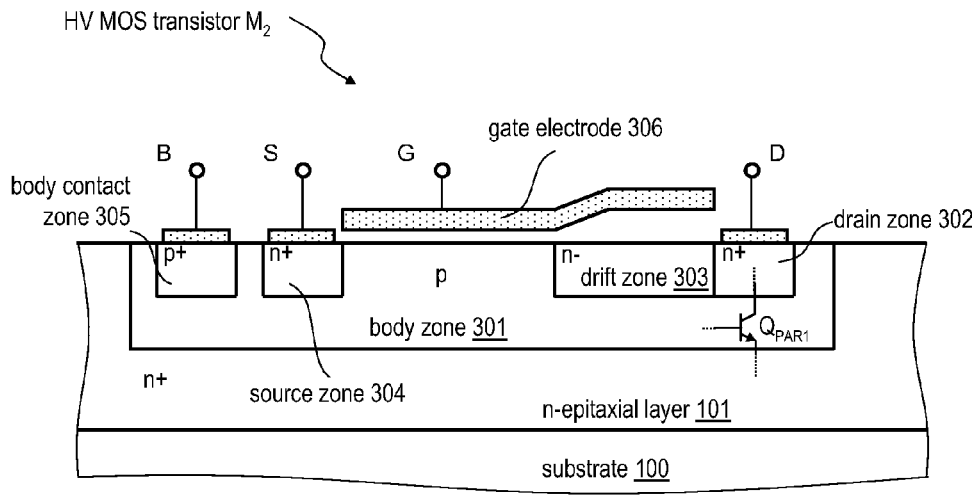
FIG. 7 illustrates, in an exemplary manner, a schematic cross section through a MOS transistor used in the OV protection circuit of FIG. 6.

FIG. 7 illustrates one exemplary implementation of the MOS transistor $M_2$. Accordingly, the MOS transistor $M_2$ is integrated in an n-doped silicon substrate 100 having an n-doped epitaxial layer 101 disposed onto (see also FIG. 4). The transistor $M_2$ is actually formed by the body zone 301, a drain zone 302, a drift zone 303, and a source zone 304. The body zone 301 is formed as a p-doped well (p-well) within the epitaxial layer 101. The drain zone 302 and the adjoining drift zone 303 are formed in the p-well and extend to the top surface of the semiconductor body. The source zone 304 is also formed in the p-well and also extending to the top surface. Drain zone 302, drift zone 303, and source zone 304 are n-doped, wherein the drift zone usually has a lower dopant concentration than the drain zone in order to provide a sufficiently high breakdown voltage. Drift zone 303 and source zone 304 are spaced apart. The portion of the body zone 302 between drift zone 303 and source zone 304 forms the channel region, over which (but isolated therefrom) the gate electrode 306 is located. The drain zone 302 is connected with a metallic drain electrode D, the source zone 304 is connected with a metallic source electrode S, and the p-well (body zone 301) is connected with a metallic body contact B via a body contact zone 305, which is p-doped but has a higher dopant concentration than the surrounding body zone 301.

In FIG. 7, one can see the parasitic npn-type bipolar junction transistor (BJT) $Q_{par1}$ formed by the drain zone 302, the body zone 301, and the n-doped substrate 100. Activation (latch-up) of this parasitic BJT $Q_{par1}$ should be avoided during reverse polarity operation, particularly during ESD events with negative voltages between −100 V (or even less) and −16 V. Such strongly negative voltage surges are suppressed using MOS transistor $M_2$ which, however, only works properly when an activation of the parasitic BJT $Q_{1PAR}$ is prevented. For this purpose, the potential of the body zone 301, the body contact zone 305 and the source zone 304 is tied to the lowest supply potential, which is—in case of a reverse polarity or a negative voltage surge (ESD)—present at the supply terminal $V_{BB}$ and thus at the substrate 100. This may be accomplished by activating the MOS transistor $M_1$ during reverse polarity operation and in the event of negative voltage surges due to electrostatic discharges (ESD) or the like. Activation of the transistor $M_1$ is accomplished by the resistors $R_1$ and $R_2$ coupled between the ground terminal GND and the supply terminal $V_{BB}$ (via diode $D_{Z1}$), thus forming a voltage divider whose middle tap is connected to the gate of transistor M1 (see FIG. 6). For supply voltages between approximately 9 V and 16 V (or up to 60 V), the resistors $R_1$ and $R_2$ may have, for example, resistance values of 2 kΩ and 13 kΩ, respectively. Both resistors $R_1$ and $R_2$ may be implemented using polycrystalline silicon (poly-silicon) as resistive material.

Figure 8:
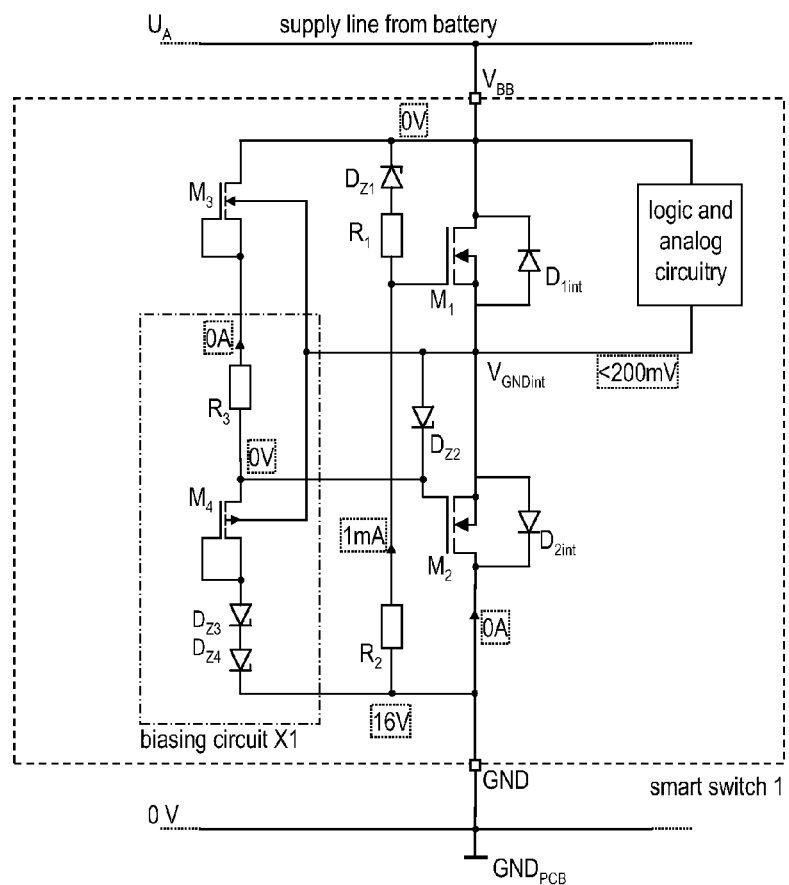
FIG. 8 illustrates another exemplary embodiment of an improved OV protection circuit in a situation of reverse polarity not exceeding a given magnitude.
Figure 9:
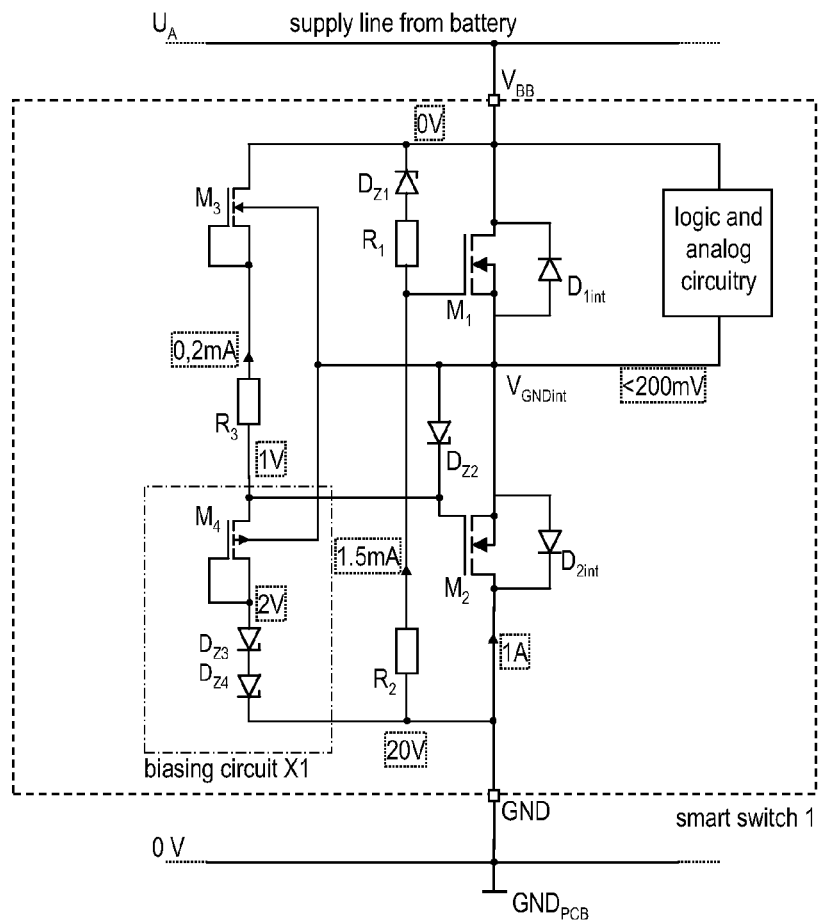
FIG. 9 illustrates the embodiment of FIG. 8 in a situation of reverse polarity exceeding a given magnitude.

The example illustrated in FIGS. 8 and 9 essentially corresponds to the example of FIG. 6. However, the biasing circuit X1 is illustrated in more detail. Using the present implementation of the biasing circuit X1, the p-channel MOS transistor $P_1$ used in the example of FIG. 1 may be (but not necessarily is) replaced by a field effect transistor $M_3$ of depletion type, e.g., a JFET (see FIG. 8). However, the MOS transistors $M_1$ and $M_2$, the zener diode $D_{Z1}$, and the voltage divider formed by the resistors $R_1$ and $R_2$ are arranged analogously to the previous example of FIG. 6 and operate in the same way in the present example of FIG. 8. The biasing circuit X1 includes a further MOS transistor $M_4$ which is coupled in series to at least one zener diode (in the present example two zener diodes $D_{Z3}$ and $D_{Z3}$). The series circuit of the depletion type transistor $M_3$ and diodes $D_{Z3}$, $D_{Z4}$ is connected between gate electrode and drain of MOS transistor $M_2$ (as the biasing circuit X1 in FIG. 6). The gate electrode and the drain of the MOS transistor $M_4$ are interconnected, and thus the MOS transistor operates as a MOS diode. The depletion type transistor $M_3$ is connected in series with a further resistor $R_3$, and the series circuit of JFET $M_3$ and resistor $R_3$ is coupled between the gate of MOS transistor $M_2$ and the supply terminal $V_{BB}$. The gate electrode and the source of the MOS transistor $M_3$ are also interconnected, so that the depletion type transistor M3 operates as a current source. However, the present solution entails less current consumption during normal operation than the example using the PMOS transistor P1 and the diode $D_{NMOS}$ (see FIG. 6). The body contacts of both transistors $M_3$ and $M_4$ are connected to the internal ground node $GND_{INT}$. The transistor M4 is an n-channel MOS transistor.

In normal operation (positive supply voltage at terminal $V_{BB}$), the transistor $M_3$ is conductive and thus pulls the gate of MOS transistor $M_2$ to a high level (e.g., 2 to 3 V due to the pinch-off characteristics of the depletion type transistor $M_3$), thus activating transistor $M_2$ (via resistor $R_3$). As a result, the potential at the internal ground node $GND_{INT}$ is closely tied to the potential at the external ground terminal GND.

The labels in FIG. 8 referring to voltage levels represent a situation of reverse polarity operation wherein the external ground terminal is at 16 V and the supply terminal at 0 V. In other words, the voltage at the supply terminal $V_{BB}$ is negative with respect to the ground terminal GND. The zener diodes $D_{Z3}$ and $D_{Z4}$ have a zener voltage of 9 V, and therefore the biasing circuit $X_1$ (MOS transistor $M_4$ in MOS diode configuration and zener diodes $D_{Z3}$ and $D_{Z4}$) does not produce a bias voltage sufficient to activate the MOS transistors $M_2$. So transistor $M_2$ is off and transistor $M_1$ is activated (i.e., on), as the voltage divider formed by resistors $R_1$ and $R_2$ (current through voltage divider, e.g., 1 mA) pulls the gate of transistor $M_1$ to a sufficient high level. Therefore, the potential at the internal ground node $GND_{INT}$ is tied close to 0 V, in the present case specified as less than 200 mV.

The labels in FIG. 9 referring to voltage levels represent a situation of a negative voltage surge exceeding a threshold of, e.g., 20 V (e.g., as a result of an electrostatic discharge). This threshold matches with the total voltage drop across the biasing circuit X1, which is twice the zener voltage of 9 V plus the threshold voltage of the MOS transistor $M_4$ of about 2V. Thus, the voltage drop across the biasing circuit X1 is limited to a total drop of 9+9+2=20 V. When a negative voltage surge of more than 20 V occurs, the MOS transistor $M_2$ is activated thus clamping the voltage drop between the internal ground node $GND_{INT}$ and the external ground terminal to about 20 V. The transistor $M_1$ is activated, as the voltage divider formed by resistors $R_1$ and $R_2$ (current through voltage divider, e.g., 1.5 mA) pulls the gate of transistor $M_1$ to a sufficient high level to turn the transistor M1 on and tie the potential at the body of transistor $M_2$ to the potential at the substrate 100 thus avoiding the activation of the parasitic BJT $Q_{PAR1}$. As in FIG. 8, the potential at the internal ground node $GND_{INT}$ is tied close to 0 V.

Figure 10:
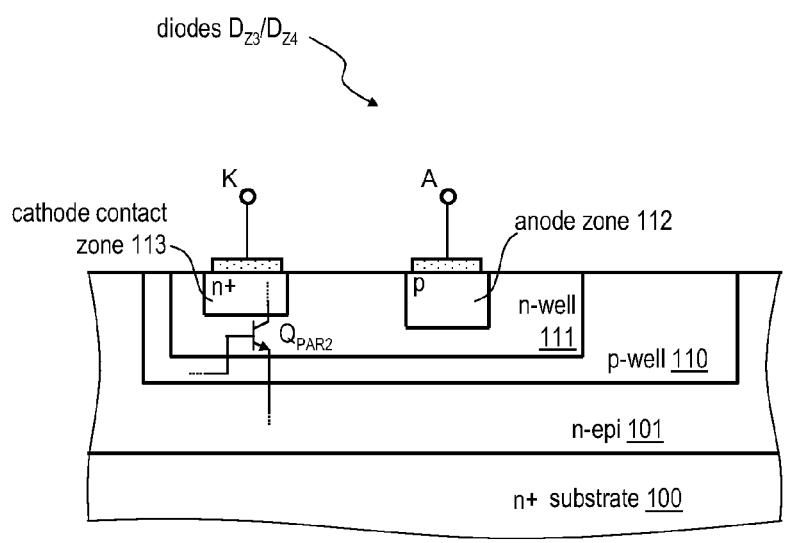
FIG. 10 illustrates, in an exemplary manner, a schematic cross section through a zener diode used in the OV protection circuit of FIGS. 6 and 8.

FIG. 10 illustrates one exemplary implementation of the zener diodes $D_{Z3}$ and $D_{Z4}$. As in the previous examples, the semiconductor body is formed by an n-doped substrate 100 and the n-doped epitaxial layer 101 disposed onto the substrate 100. A p-doped well 110 is formed in the semiconductor body and, within this well 110, an n-doped well 111 (n-well) forms the cathode zone, which is contacted by a metallic electrode C via the cathode contact zone 113, which has a higher concentration of n-type dopants than the surrounding n-well 111. A p-doped anode zone 112 is formed in the n-well and contacted by a metallic electrode. The p-well 110 may be electrically connected to the internal ground node $GND_{INT}$ to avoid a latch up of the parasitic BJT $Q_{PAR2}$ in case of reverse polarity and negative voltage surges due to ESD or the like.

Figure 11:
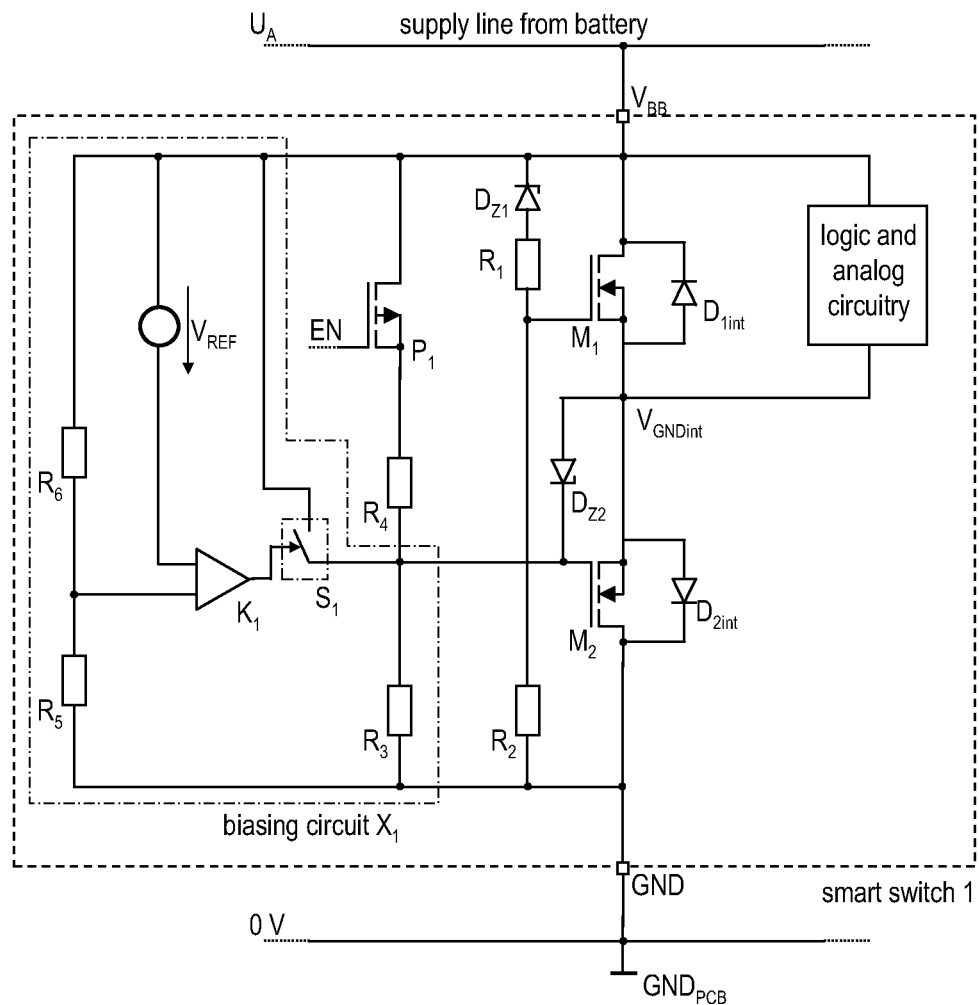
FIG. 11 illustrates another exemplary embodiment of an improved OV protection.

FIG. 11 illustrates a further alternative implementation similar to the example of FIG. 6. The example of FIG. 11 is essentially identical with the example of FIG. 6 but shows one exemplary implementation of the biasing circuit $X_1$ in more detail. In case of normal operation the MOS transistor $M_2$ may be activated (switched on) by providing an enable signal to the p-channel MOS transistor $P_1$, which will pull the gate of MOS transistor $M_2$ to a high level and switch the transistor on. The MOS transistor $M_1$ is only switched on in response to a positive excess voltage at the supply terminal $V_{BB}$ (in this case, the zener diode $D_{Z1}$ becomes conductive thus activating the transistor $M_1$) or in response to a reverse polarity (in this case the zener diode $D_{Z1}$ is forward biased and the voltage divider formed by resistors $R_1$ and $R_2$ provides a sufficiently high gate voltage to activatej transistor $M_1$).

Furthermore, in a reverse polarity situation, a voltage proportional to the (reverse) supply voltage, i.e., the voltage between the external ground terminal GND and the supply terminal $V_{BB}$, is compared to a reference voltage $V_{REF}$ (represented by a voltage source in the example of FIG. 11). The comparison is accomplished by the comparator $K_1$. When the actual magnitude of the (reverse) supply voltage is below the reference voltage, the gate of the MOS transistor $M_2$ is short-circuited (using the switch $S_1$) with the supply terminal $V_{BB}$, thus preventing the transistor $M_2$ from being activated. When the actual magnitude of the (reverse) supply voltage exceeds the reference voltage, then the switch $SW_1$ is open and the gate of the MOS transistor may be charged via a resistor $R_3$ which is connected between the gate of transistor $M_2$ and the external ground terminal GND. That is, when the reverse supply voltage exceeds a pre-defined maximum (e.g., 20 V) then the transistor $M_2$ is activating for clamping the supply voltage to, approximately, the maximum value.

Although exemplary embodiments and its advantages have been described in detail, it should be understood that various changes, substitutions and alterations can be made herein without departing from the spirit and the scope of the invention as defined by the appended claims. Particularly, numeric values for voltages, currents and resistances are provided for illustrative purposes only and are not to be regarded as limiting in any way. With the above range of variations and applications in mind, it should be understood that the present invention is not limited by the foregoing description, nor is it limited by the accompanying drawings. Instead, the present invention is limited only by the following claims and their legal equivalents.

Spatially relative terms such as "under," "below," "lower," "over," "upper" and the like are used for ease of description to explain the positioning of one element relative to a second element. These terms are intended to encompass different orientations of the device in addition to different orientations than those depicted in the figures. Further, terms such as "first," "second" and the like, are also used to describe various elements, regions, sections, etc. and are also not intended to be limiting. Like terms refer to like elements throughout the description.

What is claimed is:

1. A semiconductor device comprising:
   a semiconductor chip including a substrate;
   a ground terminal configured to be provided with a reference potential;
   a supply terminal electrically coupled to the substrate, the supply terminal configured to be provided with a load current and configured to be provided with a supply voltage between the substrate and the ground terminal;
   an overvoltage protection circuit disposed in the semiconductor chip and coupled between the supply terminal and the ground terminal, the overvoltage protection circuit comprising:
      a first transistor having a load current path coupled between the supply terminal and an internal ground node; and
      a second transistor having a load current path coupled between the internal ground node and the ground terminal,
      wherein the second transistor is configured to be switched on when the supply voltage is positive, and the first transistor is configured to be switched on when the supply voltage is negative,
      wherein the first transistor is configured to be switched off when the supply voltage is positive but below a pre-defined maximum voltage, and the second transistor is configured to be switched off when the supply voltage is negative but above a pre-defined minimum voltage, and
      wherein the first transistor is configured to be switched on when the supply voltage is positive and exceeds the pre-defined maximum voltage, and the second transistor is configured to be switched on when the supply voltage is negative and below the pre-defined minimum voltage.

2. The semiconductor device of claim 1,
   wherein the substrate is an n-doped substrate;
   wherein the second transistor is an n-channel MOS transistor that is integrated in a p-doped well arranged in the substrate and has n-doped drain and source zones, so that a parasitic npn-type bipolar junction transistor is formed by the drain zone of the second transistor, the p-doped well and the substrate;
   wherein the p-doped well is connected to the internal ground node; and
   wherein—when the supply voltage between the substrate and the ground terminal is negative—the p-doped well is connected to the substrate by activation of the first transistor, thereby preventing an activation of a parasitic BJT.

3. The semiconductor device of claim 1, wherein the substrate is an n-doped substrate and wherein the first transistor and the second transistor are n-channel MOS transistors both having an intrinsic body-drain diode.

4. The semiconductor device of claim 3,
   wherein the first transistor and the second transistor each have a source electrode electrically connected to the internal ground node;
   wherein the first transistor has a drain electrode electrically connected to the substrate; and
   wherein the second transistor has a drain electrode electrically connected to the ground terminal of the device.

5. The semiconductor device of claim 4, wherein the drain electrode of the first transistor is formed by the substrate.

6. The semiconductor device of claim 1, wherein the first transistor has a gate electrode and a drain electrode, the drain electrode being connected to the substrate and the gate electrode being coupled to the substrate via a clamping circuit.

7. The semiconductor device of claim 6, wherein the clamping circuit includes at least one zener diode.

8. The semiconductor device of claim 6, wherein the pre-defined maximum voltage depends on a threshold voltage of the clamping circuit, wherein the threshold voltage defines a voltage drop across the clamping circuit at which the clamping circuit becomes conductive.

9. The semiconductor device of claim 1, wherein the first transistor has a gate electrode, a source electrode, and a drain electrode, the drain electrode being connected to the substrate, the source electrode being coupled to the internal ground node, and the gate electrode being coupled to the ground terminal via a resistor, such that the first transistor is switched on, when the supply voltage between the substrate and the ground terminal is negative.

10. The semiconductor device of claim 1, wherein the second transistor has a gate electrode, a source electrode, and a drain electrode, the drain electrode being connected to the ground terminal, the source electrode being coupled to the internal ground node, and the gate electrode being coupled to the source electrode via a biasing circuit.

11. The semiconductor device of claim 10, wherein the biasing circuit is configured to provide sufficient gate voltage to activate the second transistor, when the supply voltage between the substrate and the ground terminal is negative and falls below the pre-defined minimum voltage.

12. The semiconductor device of claim 10, wherein the biasing circuit includes at least one zener diode having a zener voltage, the pre-defined minimum voltage depending on the zener voltage.

13. The semiconductor device of claim 10, wherein the biasing circuit includes at least one comparator which is configured to compare the supply voltage between the substrate and the ground terminal with a reference voltage, and wherein either one of a voltage of the substrate or a voltage of the ground terminal is applied to the gate electrode of the second transistor dependent on a comparison.

14. The semiconductor device of claim 13, further comprising a resistor coupled between the gate electrode of the second transistor and the ground terminal, wherein—when the supply voltage between the substrate and the ground terminal is negative—the voltage of the substrate is directly applied to the gate electrode of the second transistor dependent on the comparison.

15. The semiconductor device of claim 13, wherein—when the supply voltage between the substrate and the ground terminal is negative—the voltage of the substrate is applied to the gate electrode of the second transistor when a magnitude of a negative supply voltage is below the reference voltage.

16. The semiconductor device of claim 13, wherein—when the supply voltage between the substrate and the ground terminal is negative—the voltage of the ground terminal is applied to the gate electrode of the second transistor when a magnitude of a negative supply voltage exceeds the reference voltage thereby allowing an activation of the second transistor.

17. The semiconductor device of claim 1, wherein the second transistor has a gate electrode, a source electrode, and a drain electrode, the drain electrode being connected to the ground terminal, the source electrode being coupled to the internal ground node, and the gate electrode being coupled to the substrate via a further transistor configured to activate the second transistor when the supply voltage between the substrate and the ground terminal is positive.

* * * * *